United States Patent
Liu et al.

(10) Patent No.: US 10,657,439 B2
(45) Date of Patent: *May 19, 2020

(54) PROCESSING METHOD AND DEVICE, OPERATION METHOD AND DEVICE

(71) Applicant: Shanghai Cambricon Information Technology Co., Ltd, Pudong New Area (CN)

(72) Inventors: Shaoli Liu, Pudong New Area (CN); Xuda Zhou, Pudong New Area (CN); Zidong Du, Pudong New Area (CN); Daofu Liu, Pudong New Area (CN)

(73) Assignee: SHANGHAI CAMBRICON INFORMATION TECHNOLOGY CO., LTD, Pudong New Area (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/528,624

(22) Filed: Aug. 1, 2019

(65) Prior Publication Data

US 2019/0370642 A1    Dec. 5, 2019

(51) Int. Cl.
*G06N 3/06*    (2006.01)
*G06N 3/063*    (2006.01)
*H03M 7/42*    (2006.01)
*G06F 9/30*    (2018.01)

(52) U.S. Cl.
CPC .......... *G06N 3/063* (2013.01); *G06F 9/3001* (2013.01); *G06F 9/3005* (2013.01); *G06F 9/30029* (2013.01); *G06F 9/30145* (2013.01); *G06N 3/06* (2013.01); *H03M 7/425* (2013.01)

(58) Field of Classification Search
CPC ........................................................ G06N 3/06
USPC ........................................................ 706/33
See application file for complete search history.

(56) References Cited

PUBLICATIONS

Zhang et al ("Cannbricon-X: An Accelerator for Sparse Neural Networks" Oct. 2016) (Year: 2016).*
Li et al ("Cannbricon: An Instruction Set Architecture for Neural Networks" 2016) (Year: 2016).*

* cited by examiner

*Primary Examiner* — Lut Wong
(74) *Attorney, Agent, or Firm* — Getech Law LLC; Jun Ye

(57) ABSTRACT

The application provides an operation method and device. Quantized data is looked up to realize an operation, which simplifies the structure and reduces the computation energy consumption of the data, meanwhile, a plurality of operations are realized.

18 Claims, 3 Drawing Sheets

US 10,657,439 B2

PROCESSING METHOD AND DEVICE, OPERATION METHOD AND DEVICE

TECHNICAL FIELD

The disclosure relates to the field of data processing, and particularly to a processing method and device, an operation method and device.

BACKGROUND

Neural networks have been successfully applied. However, lots of parameters and large-scale computation of a neural network become a huge challenge to neural network application. On one hand, lots of parameters make a very high requirement on a storage capacity and also result in high memory access energy consumption. On the other hand, large-scale computation makes a very high requirement on design of a computation unit and also results in high computation energy consumption. Therefore, how to reduce parameters and computation amount of a neural network becomes a problem urgent to be solved.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The present disclosure describes examples for data processing in neural networks. An example device may include an instruction control unit configured to decode a received instruction and generate lookup control information and a lookup table unit configured to identify output neurons in an operation codebook according to the lookup control information and a received weight dictionary, a neuron dictionary, an operation codebook, weights, and input neurons.

An example method may include receiving weights, input neurons, an instruction, a weight dictionary, a neuron dictionary, and an operation codebook; decoding the instruction to determine lookup control information; and identifying output neurons in the operation codebook according to the lookup control information, the weights, the weight dictionary, the neuron dictionary, and the input neurons.

To the accomplishment of the foregoing and related ends, the one or more aspects comprise the features herein after fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION OF THE EMBODIMENTS

In order to make the purpose, technical solutions and advantages of the disclosure clearer, the disclosure will further be described below in combination with specific embodiments and with reference to the drawings in detail.

For the technical defect in related arts that a huge amount of computation for data processing of a neural network may hinder application of the neural network, the application provides a processing method and device and an operation method and device. By the processing method and device, two types of data, for example, input neurons and weights, are quantized to mine similarities between interlayer data and inter-segment data and local similarities between intra-layer data and intra-segment data respectively, so as to mine distribution characteristics of the two types of data, and low-bit quantization is performed to reduce the count of bits configured to represent each piece of data. Therefore, a data storage overhead and a memory access overhead are reduced. According to the processing method and device, a table lookup operation is performed to implement a computational operation over the quantized neurons and weights, so that memory access energy consumption and computation energy consumption of a neural network are reduced.

Input neurons and output neurons mentioned in the application do not refer to neurons in an input layer and neurons in an output layer in the whole neural network. For any two adjacent layers in the network, neurons in a lower layer for feedforward computation of the network are input neurons and neurons in an upper layer for the feedforward computation of the network are output neurons. For example, for a convolutional neural network, assume that the convolutional neural network has L layers, and K=1, 2, ..., L−1. For the $K^{th}$ layer and the $(K+1)^{th}$ layer, the $K^{th}$ layer may be an input layer in which neurons are input neurons, and the $(K+1)^{th}$ layer may be an output layer in which neurons are output neurons. In other words, except a top layer, each layer may be determined as an input layer, and a layer below it may be a corresponding output layer.

In order to make the purpose, technical solutions, and advantages of the application clearer, the application will further be described below in combination with specific embodiments and with reference to the drawings in detail.

Figure 1A:
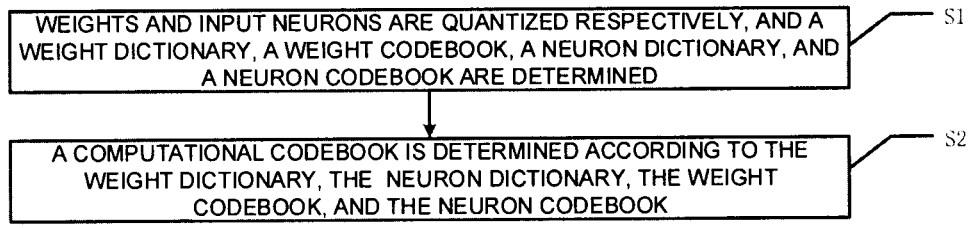
FIG. 1A is a schematic flowchart of a processing method according to an embodiment of the application.

FIG. 1A is a schematic flowchart of a processing method according to an embodiment of the application. As shown in FIG. 1A, the processing method may include the following.

In S1, weights and input neurons are quantized respectively, and a weight dictionary, a weight codebook, a neuron dictionary, and a neuron codebook are determined.

A process of quantifying the weights may include the following:

grouping the weights, adopting a clustering algorithm to perform a clustering operation on the weights of each group to divide the weights of each group into m types, in which m may be a positive integer and the weights of each type corresponding to a weight index, and determining the weight dictionary, where the weight dictionary may include weight positions and weight indices, and the weight positions refer to positions of the weights in a neural network structure;

replacing all the weights of each type with a central weight, and determining the weight codebook, where the weight codebook may include the weight indices and the central weights.

Figure 1B:
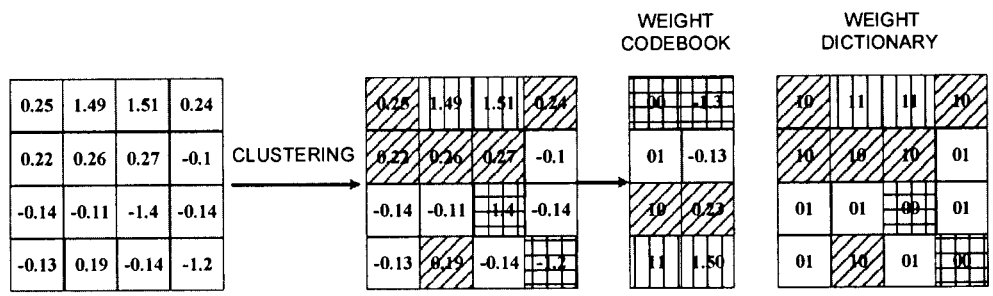
FIG. 1B is a schematic diagram of a process of quantizing weights according to an embodiment of the application.

FIG. 1B is a schematic diagram of a process of quantifying weights according to an embodiment of the application. As shown in FIG. 1B, the weights are grouped according to a preset grouping strategy to obtain a weight matrix which is arranged in order. Then, intra-group sampling and the clustering operation are performed on the weight matrix obtained by grouping. The weights with approximate numerical values are divided into the same types. Central weights 1.50, −0.13, −1.3, and 0.23 under four types are computed according to a loss function, and correspond to the weights of the four types respectively. In a known weight codebook, a weight index of the type with the central weight −1.3 is 00, a weight index of the type with the central weight −0.13 is 01, a weight index of the type with the central weight 0.23 is 10, and a weight index of the type with the central weight 1.50 is 11. In addition, the four weight indices (00, 01, 10, and 11) corresponding to the four central weights are adopted to represent the weights in the corresponding types respectively, such that a weight dictionary is obtained. It is to be noted that the weight dictionary further may include weight positions, for example, the positions of the weights in the neural network structure. In the weight dictionary, a weight position refers to a coordinate, for example, (p, q), of the $p^{th}$ row and the $q^{th}$ column. In the embodiment, $1 \leq p \leq 4$ and $1 \leq q \leq 4$.

Thus it can be seen that, by the quantization process, similarities between interlayer weights and local similarities between intra-layer weights in the neural network are fully mined to obtain a distribution characteristic of the weights of the neural network, and low-bit quantization may be performed to reduce the count of bits configured to represent each weight. Therefore, a weight storage overhead and a memory access overhead are reduced.

In some implementations, the preset grouping strategy may include, but is not limited to, the following strategies: division into a group: all the weights in a neural network are divided into a group; layer-type-based grouping: weights of all convolutional layers, weights of all fully connected layers, and weights of all LSTM network layers in the neural network are divided into a group respectively; interlayer grouping: weights of one or more convolutional layers, weights of one or more fully connected layers, and weights of one or more LSTM network layers in the neural network are divided into a group respectively; and intra-layer grouping: weights in a layer of the neural network are segmented, and each segmented part is divided into a group.

The clustering algorithm may include K-means, K-medoids, Clara, and/or Clarans. A selection method for the central weight corresponding to each type may include that: a value of $W_0$ corresponding to a minimum cost function $J(w,w_0)$ is determined as the central weight. The cost function may be a squared distance function:

$$J(w, w_0) = \sum_{i=1}^{n} (w_i - w_0)^2,$$

where J is the cost function, W refers to all the weights of the type, $W_0$ is the central weight, n is the count of all the weights of the type, $W_i$ is the $i^{th}$ weight of the type, $1 \leq i \leq n$, and n is a positive integer.

Furthermore, describing quantization of the input neurons may include the following:

dividing the input neurons divided into p segments, in which the input neurons of each segment may correspond to a neuron range and a neuron index, and determining the neuron dictionary, in which p may be a positive integer;

coding the input neurons, replacing all the input neurons of each segment with a central neuron, and determining the neuron codebook.

Figure 1C:
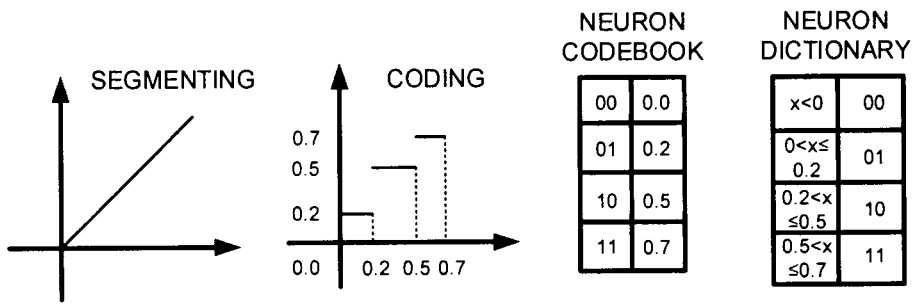
FIG. 1C is a schematic diagram of a process of quantizing input neurons according to an embodiment of the application.

FIG. 1C is a schematic diagram of a process of quantifying input neurons according to an embodiment of the application. As shown in FIG. 1C, specific descriptions will be made in the embodiment with quantization of neurons of a ReLU activation layer as an example. A ReLU function is segmented into totally four segments. Central neurons of the four segments are represented by 0.0, 0.2, 0.5, and 0.7 respectively, and neuron indices are represented by 00, 01, 10, and 11. A neuron codebook and a neuron dictionary are finally generated, where the neuron codebook may include the neuron indices and the central neurons, and the neuron dictionary may include neuron ranges and the neuron indices. The neuron ranges and the neuron indices are correspondingly stored and x (shown in FIG. 1C) represents a value of a neuron if the neuron is not quantized. By the quantization process of the input neurons, the input neurons may be divided into multiple segments according to a practical requirement, an index of each segment is obtained, and then the neuron dictionary is formed. Then, the input neurons in each segment are replaced with the central neurons in the neuron codebook according to the neuron indices. Similarities between the input neurons may be fully mined to obtain a distribution characteristic of the input neurons, and low-bit quantization is performed to reduce the count of bits representing each input neuron, so that an input neuron storage overhead and a memory access overhead are reduced.

In S2, determining a computational codebook according to the weight codebook and the neuron codebook may include the following:

determining the corresponding weight indices in the weight codebook according to the weights, and determining the central weights corresponding to the weights through the weight indices;

determining the corresponding neuron indices in the neuron codebook according to the input neurons, and determining the central neurons corresponding to the input neurons through the neuron indices; and performing a computational operation on the central weights and the central neurons to obtain computational results, and forming the computational results to a matrix so as to determine the computational codebook.

Figure 1D:
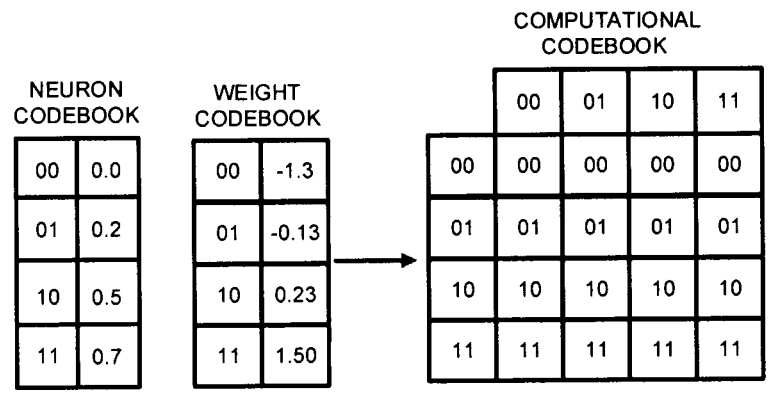
FIG. 1D is a schematic diagram of a process of determining an operational codebook according to an embodiment of the application.

FIG. 1D is a schematic diagram of a process of determining a computational codebook according to an embodiment of the application. As shown in FIG. 1D, a multiplication codebook is taken as an example in the embodiment.

In other embodiments, the computational codebook may also be an addition codebook, a pooling codebook, and the like, which is not limited herein. According to a weight dictionary, weight indices corresponding to weights are determined, and central weights corresponding to the weight indices are determined. According to a neuron codebook, neuron indices corresponding to input neurons are determined, and central neurons corresponding to the neuron indices are determined. The neuron indices and the weight indices are taken as row indices and column indices of the computational codebook, multiplication computation is performed on the central neurons and the central weights, and a matrix is formed to obtain the multiplication codebook.

After S2, the method may further include the following. The weights and the input neurons are retrained. During retraining, only the weight codebook and the neuron codebook are trained, and contents in the weight dictionary and the neuron dictionary are kept unchanged, so that a retraining operation is simplified and a workload is reduced. Preferably, a back propagation algorithm is adopted for retraining.

Figure 1E:
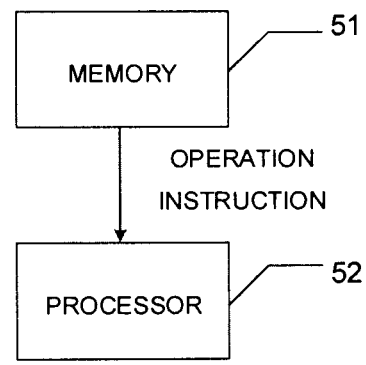
FIG. 1E is a schematic structure diagram of a processing device according to an embodiment of the application.

FIG. 1E is a schematic structure diagram of a processing device according to an embodiment of the application. As shown in FIG. 1E, the processing device may include a memory 51 and a processor 52.

The memory 51 may be configured to store a computation instruction.

The processor 52 may be configured to perform the computation instruction stored in the memory, in which the computation instruction may be performed for operations according to the abovementioned processing method. The computation instruction may be a binary number including an operation code and an address code. The operation code indicates an operation to be performed by the processor 52. The address code instructs the processor 52 to read data participating in the operation from an address in the memory 51.

According to the data processing device of the application, the processor 52 can perform the operations of the abovementioned data processing method by performing the computation instruction in the memory 51. Disordered weights and input neurons may be quantized to obtain low-bit and normalized central weights and central neurons. Local similarities between the weights and the input neurons can be mined to obtain distribution characteristics of the weights and the input neurons, and low-bit quantization can be performed according to the distribution characteristics to reduce the count of bit representing each weight and input neuron. Therefore, a storage overhead and a memory access overhead of the weights and the input neurons are reduced.

Figure 1F:
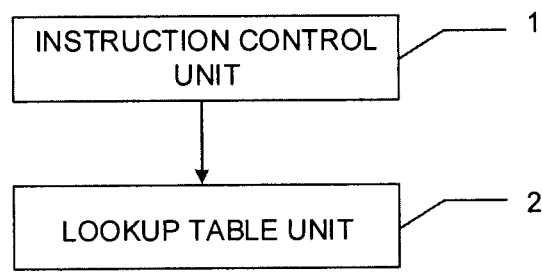
FIG. 1F is a schematic structure diagram of an operation device according to an embodiment of the application.

FIG. 1F is a schematic structure diagram of an operation device according to an embodiment of the application. As shown in FIG. 1F, the operation device may include an instruction control unit 1 and a lookup table unit 2.

The instruction control unit 1 may be configured to decode a received instruction and generate lookup control information.

The lookup table unit 2 may be configured to look output neurons up in a computational codebook according to the lookup control information generated by the instruction control unit 1 and a received weight dictionary, neuron dictionary, computational codebook, weights, and input neurons. The weight dictionary may include weight positions (for example, positions of the weights in a neural network structure, for example, represented by (p, q), which representing a position in the $p^{th}$ row and the $q^{th}$ column in the weight dictionary) and weight indices. The neuron dictionary may include the input neurons and neuron indices. The computational codebook may include the weight indices, the neuron indices, and computational results of the input neurons and the weights.

A specific working process of the lookup table unit is as follows: determining the corresponding weight position of the weight in the weight dictionary according to the weights, determining the weight indices, determining the neuron indices according to corresponding neuron ranges of the input neurons in the neuron dictionary, determining the weight indices and the neuron indices as column indices and row indices of the computational codebook, looking up numerical values corresponding to the columns and rows (the computational results) in the computational codebook, where the numerical values are the output neurons.

As illustrated in FIG. 1B to FIG. 1D, during a lookup operation, if a neuron index of a certain neuron is 01 and a weight index of a certain weight is 10, if computation is performed on the neuron and the weight, a corresponding numerical value 0.046 in the second row and the third column in the multiplication codebook is looked up. The corresponding numerical value is an output neuron. Similarly, addition and pooling operations are similar to a multiplication operation and will not be elaborated herein. It can be understood that pooling may include, but is not limited to, average pooling, maximum pooling, and median pooling.

In one implementation, according to different computational operations, a lookup table may include at least one of a multiplication lookup table, an addition lookup table, and a pooling lookup table.

The multiplication lookup table may be configured to perform a table lookup operation mult_lookup, according to an input weight index in1 input and an neuron index in2, through the multiplication lookup table to complete a multiplication operation over a central weight data1 corresponding to the weight index and a central neuron data2 corresponding to the neuron index, for example, performing a table lookup operation out=mult_lookup(in1,in2) to realize a multiplication function out=data1*data2.

The addition lookup table may be configured to perform a table lookup operation add_lookup through a step-by-step addition lookup table according to an input index in to complete an addition operation over central data data corresponding to the index, where in and data are vectors with lengths of N and N is a positive integer, for example, performing a table lookup operation out=add_lookup(in) to realize an addition function out=data[1]+data[2]+ . . . +data[N]; and/or to perform a table lookup operation on the input weight index in1 and the neuron index in2 through the addition lookup table to complete an addition operation over a central weight data1 corresponding to the weight index and a central neuron data2 corresponding to the neuron index, for example, performing a table lookup operation out=add_lookup(in1,in2) to realize an addition function out=data1+data2.

The pooling lookup table may be configured to perform a pooling operation on the central data data corresponding to the input index, for example, performing a table lookup operation out=pool lookup(in) to complete a pooling operation out=pool(data), the pooling operation including average pooling, maximum pooling, and median pooling.

Figure 1G:
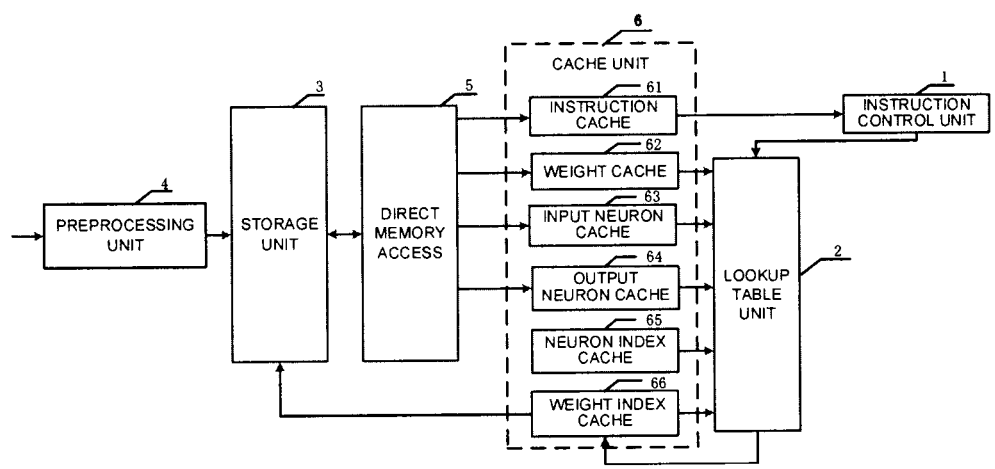
FIG. 1G is a schematic structure diagram of an operation device according to another embodiment of the application.

FIG. 1G is a schematic structure diagram of another operation device according to an embodiment of the application. As shown in FIG. 1G, compared with the operation device in FIG. 1F, the operation device of the embodiment further may include a preprocessing unit 4, a storage unit 3, a cache unit 6, and a DMA 5. A processing process of the application may be optimized, and data may be processed in a more ordered manner.

The preprocessing unit 4 may be configured to preprocess input information which is externally input to obtain the weights, the input neurons, the instruction, the weight dictionary, the neuron dictionary, and the computational codebook. Preprocessing may include, but is not limited to, segmentation, Gaussian filtering, binarization, regularization, and/or normalization.

The storage unit 3 may be configured to store the input neurons, the weights, the weight dictionary, the neuron dictionary, the computational codebook, and the instruction and to receive the output neurons.

The cache unit 6 may be configured to cache the instruction, the weight indices, the neuron indices, and the output neurons. The cache unit 6 may include an instruction cache 61, a weight cache 62, an input neuron cache 63, an output neuron cache 64, a neuron index cache 65, and a weight index cache 66.

The instruction cache 61 may be configured to cache the instruction and to output the cached instruction to the instruction control unit 1.

The weight cache 62 may be configured to cache the weights and to output the cached weights to the lookup table unit 2.

The input neuron cache 63 may be configured to cache the input neurons and to output the cached input neurons to the lookup table unit 2.

The output neuron cache 64 may be configured to cache the output neurons output by the lookup table unit 2 and to output the cached output neurons to the lookup table unit 2.

The neuron index cache 65 may be configured to determine the corresponding neuron indices according to the input neurons, to cache the neuron indices, and to output the cached neuron indices to the lookup table unit 2.

The weight index cache 66 may be configured to determine the corresponding weight indices according to the weights, to cache the weight indices, and to output the cached weight indices to the lookup table unit 2.

The DMA 5 may be configured to read and write data or instructions between the storage unit 3 and the cache unit 6.

In one implementation, regarding the instruction, the instruction may be a neural network-dedicated instruction, including all instructions dedicated to completion of artificial neural network computations. The neural network-dedicated instruction may include, but is not limited to, a control instruction, a data transfer instruction, a computational instruction, and a logical instruction. The control instruction controls a neural network performing process. The data transfer instruction completes data transfer between different storage media, and a data format may include, but is not limited to, a matrix, a vector, and a scalar. The computational instruction completes arithmetic operation of the neural network, and may include, but is not limited to, a matrix computation instruction, a vector computation instruction, a scalar computation instruction, a convolutional neural network computation instruction, a fully connected neural network computation instruction, a pooling neural network computation instruction, an RBM neural network computation instruction, an LRN neural network computation instruction, an LCN neural network computation instruction, an LSTM neural network computation instruction, a recurrent neural network (RNN) computation instruction, an ReLU neural network computation instruction, a PReLU neural network computation instruction, a sigmoid neural network computation instruction, and a neural network computation instruction, and a maxout neural network computation instruction. The logical instruction may be configured to complete logical operation of the neural network, and may include, but is not limited to, a vector logical operation instruction and a scalar logical operation instruction.

The RBM neural network computation instruction may be configured to implement RBM neural network computation.

The LRN neural network computation instruction may be configured to implement LRN neural network computation.

The LSTM neural network computation instruction may be configured to implement LSTM neural network computation.

The RNN computation instruction may be configured to implement RNN computation.

The ReLU neural network computation instruction may be configured to implement ReLU neural network computation.

The PReLU neural network computation instruction may be configured to implement PReLU neural network computation.

The sigmoid neural network computation instruction may be configured to implement sigmoid growth curve (sigmoid) neural network computation.

The tan h neural network computation instruction may be configured to implement hyperbolic tangent function (tan h) neural network computation.

The maxout neural network computation instruction may be configured to implement maxout neural network computation.

Furthermore, the neural network-dedicated instruction may include a Cambricon instruction set. The Cambricon instruction set may include at least one Cambricon instruction, with a length of the Cambricon instruction being 64 bit, including an operation code and an operand. The Cambricon instruction set may include four types of instructions, for example, Cambricon control instructions, Cambricon data transfer instructions, Cambricon computational instructions, and Cambricon logical instructions respectively.

In one implementation, the Cambricon control instruction may be configured to control a performing process including a jump instruction and a conditional branch instruction.

In one implementation, the Cambricon data transfer instruction may be configured to complete data transfer between different storage media including a load instruction, a store instruction, and a move instruction. The load instruction may be configured to load data from a main memory to a cache. The store instruction may be configured to store the data from the cache to the main memory. The move instruction may be configured to move the data between the cache and another cache, the cache and a register, or the register and another register. The data transfer instruction supports three different data organization manners, including the matrix, the vector, and the scalar.

In one implementation, the Cambricon computational instruction may be configured to complete the arithmetic operation of the neural network. The Cambricon computational instruction may include a Cambricon matrix computation instruction, a Cambricon vector computation instruction, and a Cambricon scalar computation instruction.

In one implementation, the Cambricon matrix computation instruction may be configured to complete matrix computation in the neural network, including matrix multiply vector, vector multiply matrix, matrix multiply scalar, outer product, matrix add matrix, and matrix subtract matrix.

In one implementation, the Cambricon vector computation instruction may be configured to complete vector computation in the neural network, including vector basic operations, vector transcendental functions, dot product, random vector generator, and maximum/minimum of a vector. The vector basic operations include vector addition, subtraction, multiplication, and division. The vector transcendental functions refer to those functions which do not meet any polynomial equations taking polynomials as coefficients, and include, but are not limited to, an exponential function, a logarithmic function, a trigonometric function, and an anti-trigonometric function.

In one implementation, the Cambricon scalar computation instruction may be configured to complete scalar computation in the neural network, including scalar basic operations and scalar transcendental functions. The scalar basic operations include scalar addition, subtraction, multiplication, and division. The scalar transcendental functions refer to those functions which do not meet any polynomial equations taking polynomials as coefficients, and include, but are not limited to, an exponential function, a logarithmic function, a trigonometric function, and an anti-trigonometric function.

In one implementation, the Cambricon logical instruction may be configured to complete the logical operation of the neural network. The Cambricon logical instruction may include the Cambricon vector logical operation instruction and the Cambricon scalar logical operation instruction. The Cambricon vector logical operation instruction may be configured to complete vector compare computation, vector logical operations, and vector greater than merge computation. The vector compare computation may include, but is not limited to, greater than, smaller than, equal to, more than or equal to, less than or equal to, and unequal to. The vector logical operations include AND, OR, and NOT.

In one implementation, the Cambricon scalar logical operation instruction may be configured to complete scalar compare computation and scalar logical operations. The scalar compare computation may include, but is not limited to, greater than, smaller than, equal to, more than or equal to, less than or equal to, and unequal to. The scalar logical operations include AND, OR, and NOT.

Figure 1H:
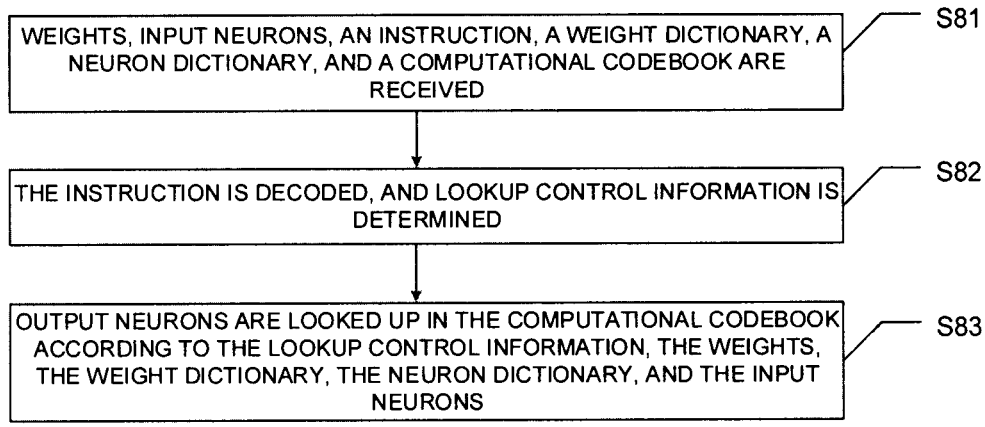
FIG. 1H is a schematic flowchart of another operation method according to an embodiment of the application.

FIG. 1H is a schematic flowchart of another operation method according to an embodiment of the application. As shown in FIG. 1H, the operation method may include the following:

in S81, receiving weights, input neurons, an instruction, a weight dictionary, a neuron dictionary, and a computational codebook, where the weight dictionary may include weight positions and weight indices, the neuron dictionary may include the input neurons and neuron indices, the computational codebook may include the weight indices, the neuron indices, and computational results of the input neurons and the weights;

in S82, decoding the instruction, and determining lookup control information;

in S83, looking up output neurons in the computational codebook according to the lookup control information, the weights, the weight dictionary, the neuron dictionary, and the input neurons.

S83 is similar to the specific working process of the lookup table unit and may include the following:

according to the weights, the input neurons, the weight dictionary, and the neuron dictionary, determining neuron ranges to determine the neuron indices in the neuron dictionary, and determining the weight positions to determine the weight indices in the weight dictionary;

looking up the computational results in the computational codebook according to the weight indices and the neuron indices to determine the output neurons.

Figure 1I:
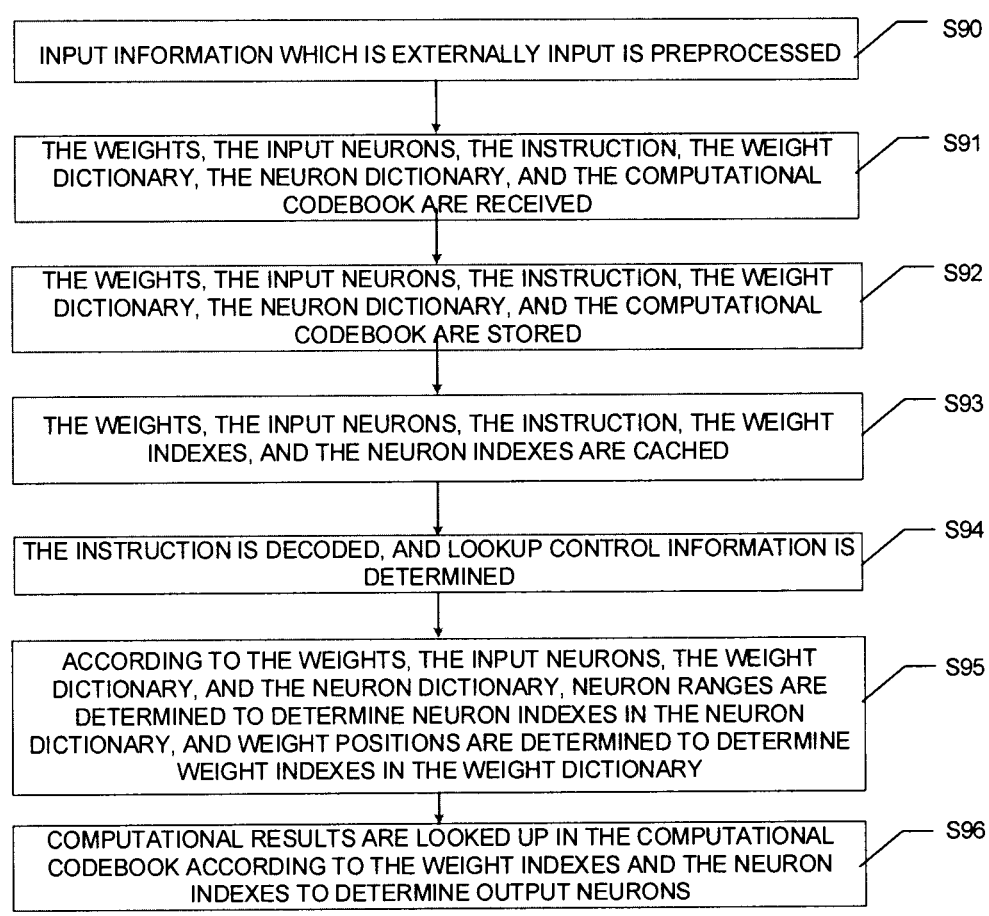
FIG. 1I is a schematic flowchart of another operation method according to an embodiment of the application.

For optimizing the operation method of the application and ensuring more convenient and ordered processing, an embodiment of the application provides another operation method. FIG. 1I is a schematic flowchart of another operation method according to an embodiment of the application. The operation method may include the following.

In S90, input information which is externally input is preprocessed.

In one implementation, preprocessing the input information which is externally input may include: obtaining weights, input neurons, instruction, weight dictionary, neuron dictionary, and computational codebook corresponding to the input information are obtained. Preprocessing may include segmentation, Gaussian filtering, binarization, regularization, and/or normalization.

In S91, the weights, the input neurons, the instruction, the weight dictionary, the neuron dictionary, and the computational codebook are received.

In S92, the weights, the input neurons, the instruction, the weight dictionary, the neuron dictionary, and the computational codebook are stored.

In S93, the weights, the input neurons, the instruction, the weight indices, and the neuron indices are cached.

In S94, the instruction is decoded, and lookup control information is determined.

In S95, according to the weights, the input neurons, the weight dictionary, and the neuron dictionary, neuron ranges are determined to determine neuron indices in the neuron dictionary, and weight positions are determined to determine weight indices in the weight dictionary.

In S96, computational results are looked up in the computational codebook according to the weight indices and the neuron indices to determine output neurons.

It is to be noted that each unit or module may be a circuit, including a digital circuit, an analogue circuit, and the like. Physical implementation of a structure of each unit or module may include, but is not limited to, a physical device, which may include, but is not limited to, a transistor, a memristor, and the like. The chip or the neural network processor may be any proper hardware processor, for example, a CPU, a GPU, an FPGA, a digital signal processor (DSP), and an ASIC. The storage unit may be any proper magnetic storage medium or magneto-optic storage medium, for example, a resistive random access memory (RRAM), a DRAM, a SRAM, an enhanced dynamic random access memory (EDRAM), a high bandwidth memory (HBM), and a hybrid memory cube (HMC), and the like.

The application may be applied to numerous universal or dedicated computer system environments or configurations, for example, a personal computer (PC), a server computer, a handheld device or a portable device, a tablet device, a multiprocessor system, a microprocessor-based system, a set-top box, a programmable consumer electronic device, a network PC, a minicomputer, a large computer, and a distributed computation environment including any above-mentioned system or device.

According to an embodiment, the application provides a chip, which may include the abovementioned operation device. The chip may simultaneously perform various types of computation on a weight and an input neuron to achieve computational diversity. In addition, a dedicated on-chip cache for the multilayer artificial neural network computation algorithm is adopted, so that reusability of the input neurons and the weight data is fully mined, repeated reading of these data from the memory is avoided, a memory access bandwidth is reduced, and the problem that a memory bandwidth becomes a performance bottleneck of multilayer artificial neural network computation and a training algorithm of the multilayer artificial neural network computation is solved.

An embodiment of the application provides a chip package structure, which may include the abovementioned neural network processor.

An embodiment of the application provides a board card, which may include the abovementioned chip package structure.

An embodiment of the application provides an electronic device, which may include the abovementioned board card.

The electronic device may include, but is not limited to, a robot, a computer, a printer, a scanner, a tablet computer, an intelligent terminal, a mobile phone, an automobile data recorder, a navigator, a sensor, a webcam, a cloud server, a camera, a video camera, a projector, a watch, an earphone, a mobile storage, a wearable device, a transportation means, a household electrical appliance, and a medical device.

The transportation means may include an airplane, a ship, and/or a vehicle. The household electrical appliance may include a television, an air conditioner, a microwave oven, a refrigerator, an electric rice cooker, a humidifier, a washing machine, an electric lamp, a gas cooker, and a range hood. The medical device may include a nuclear magnetic resonance spectrometer, a B-ultrasonic scanner, and/or an electrocardiograph.

Those of ordinary skill in the art may realize that the units and algorithm steps of each example described in combination with the embodiments of the application may be implemented by electronic hardware, computer software, or a combination of the two. For clearly describing exchangeability of the hardware and the software, compositions and steps of each example have been generally described in the descriptions according to functions. Whether these functions are performed in a hardware or software manner depends on specific applications and design constraints of the technical solutions. Professionals may realize the described functions for each specific application by use of different methods, but such realization shall fall within the scope of the application.

Those skilled in the art may clearly know that, for convenient and brief description, working processes of terminals and units described above may refer to the corresponding processes in the method embodiments and will not be elaborated herein.

In the embodiments provided by the application, it is to be understood that the disclosed terminals and methods may be implemented in other manners. For example, the device embodiment described above is only schematic. For example, division of the units is only logical function division and another division manner may be adopted during practical implementation. For example, multiple units or components may be combined or integrated into another system or some characteristics may be neglected or not performed. In addition, coupling, direct coupling, or communication connection between each displayed or discussed component may be indirect coupling or communication connection, implemented through some interfaces, devices, or units, and may be electrical, mechanical, or in other forms.

The units described as separate parts may or may not be physically separated. Parts displayed as units may or may not be physical units, and for example, may be located in the same place, or may also be distributed in multiple network units. Part or all of the units may be selected to achieve the purpose of the solutions of the embodiments of the application according to a practical requirement.

In addition, each functional unit in the embodiments of the application may be integrated into a processing unit, each unit may also physically exist independently, and two or more units may also be integrated into one unit. The integrated unit may be implemented in the form of hardware or a software functional unit.

If being implemented in the form of a software functional unit and sold or used as an independent product, the integrated unit may be stored in a computer-readable storage medium. Based on such an understanding, all or part of the technical solutions may be embodied in form of software product. The computer software product is stored in a storage medium, including a plurality of instructions configured to enable a computer device (which may be a PC, a server, a network device, or the like) to perform all or part of the operations of the method in each embodiment of the application. The storage medium may include various media capable of storing program codes such as a U disk, a mobile hard disk, a read-only memory (ROM), a random access memory (RAM), a magnetic disk, or an optical disk.

It is to be noted that implementation modes which are not shown or described in the drawings or the body of the specification are all in forms known to those of ordinary skill in the art and are not described in detail. In addition, the definitions about each component and method are not limited to each specific structure, shape, or manner mentioned in the embodiments, to which those of ordinary skill in the art may make simple modifications or replacements.

The purposes, technical solutions, and beneficial effects of the application are further described above with the specific embodiments in detail. It is to be understood that the above is only the specific embodiment of the application and not intended to limit the application. Any modifications, equivalent replacements, improvements, and the like made within the spirit and principle of the application shall fall within the scope of protection of the application.

What is claimed:

1. An operation device, comprising:
   an instruction control unit configured to decode a received instruction and generate lookup control information; and
   a lookup table unit configured to identify output neurons in an operation codebook according to the lookup control information and a received weight dictionary, a neuron dictionary, an operation codebook, weights, and input neurons, wherein the instruction is a neural network-dedicated instruction, and the neural network-dedicated instruction includes:
   a control instruction configured to control a neural network execution process;
   a data transfer instruction configured to complete data transfer between different storage media, a data format including a matrix, a vector, and a scalar;
   an computation instruction configured to complete arithmetic operation of a neural network and including a matrix computation instruction, a vector computation instruction, a scalar computation instruction, a convolutional neural network computation instruction, a fully connected neural network computation instruction, a pooling neural network computation instruction, a Restricted Boltzmann Machine (RBM) neural network computation instruction, a Local Response Normalization (LRN) neural network computation instruction, a Local Response Normalization (LRN) neural network computation instruction, a Long Short-Term Memory (LSTM) neural network computation instruction, a Recurrent Neural Networks (RNN) computation instruction, a rectified linear unit (ReLU) neural network computation instruction, a parametric rectified linear unit (PReLU) neural network computation instruction, a sigmoid neural network computation instruction, a tan h neural network computation instruction, and a maxout neural network computation instruction; and a logical instruction configured to complete logical operation of the neural network and including a vector logical computation instruction and a scalar logical computation instruction.

2. The operation device of claim 1,
wherein the weight dictionary includes weight positions and weight indexes,
wherein the neuron dictionary includes the input neurons and neuron indexes, and
wherein the operation codebook includes the weight indexes, the neuron indexes, and operation results of the input neurons and the weights.

3. The operation device of claim 2, further comprising:
a preprocessing unit configured to preprocess input information to obtain the weights, the input neurons, the instruction, the weight dictionary, the neuron dictionary, and the operation codebook;
a storage unit configured to store the input neurons, the weights, the weight dictionary, the neuron dictionary, the operation codebook, and the instruction, and receive the output neurons;
a cache unit configured to cache the instruction, the input neurons, the weights, the weight indexes, the neuron indexes, and the output neurons; and
a direct memory access (DMA) configured to read and write data or instructions between the storage unit and the cache unit.

4. The operation device of claim 3, wherein the cache unit includes:
an instruction cache configured to cache the instruction and output the cached instruction to the instruction control unit;
a weight cache configured to cache the weights;
an input neuron cache configured to cache the input neurons; and
an output neuron cache configured to cache the output neurons output by the lookup table unit.

5. The operation device of claim 4, wherein the cache unit further includes:
a weight index cache configured to cache the weight indexes; and
a neuron index cache configured to cache the neuron indexes.

6. The operation device of claim 3, wherein the preprocessing unit is configured to preprocess the input information according to one or more algorithms that include segmentation, Gaussian filtering, binarization, regularization, and/or normalization.

7. The operation device of claim 2, wherein the lookup table unit includes at least one lookup table selected from a group consisting of:
a multiplication lookup table that includes one or more multiplication results,
wherein each of the one or more multiplication results respectively corresponds to a central weight and a central neuron,
wherein the central weight corresponds to one of the weight indexes, and
wherein the central neuron corresponds to one of the neuron indexes;

an addition lookup table that includes one or more addition results, wherein each of the one or more addition results respectively corresponds to the central weight and the central neuron; and
a pooling lookup table that includes one or more pooling results that respectively correspond to a central data, wherein the one or more pooling results are determined based on pooling operations including average pooling, maximum pooling, and median pooling.

8. The operation device of claim 1, wherein the neural network-dedicated instruction includes at least one Cambricon instruction including an operation code and an operand, and the Cambricon instruction includes:
a Cambricon control instruction configured to control the execution process, including a JUMP instruction and a conditional branch instruction;
a Cambricon data transfer instruction configured to complete data transfer between different storage media and including a load instruction, a store instruction, and a move instruction, where the load instruction is configured to load data from a main memory to a cache, the store instruction is configured to store the data from the cache to the main memory, and the move instruction is configured to move the data between the cache and another cache, between the cache and a register, or between the register and another register;
a Cambricon computation instruction configured to complete the arithmetic operation of the neural network and including a Cambricon matrix computation instruction, a Cambricon vector computation instruction, and a Cambricon scalar computation instruction, where the Cambricon matrix computation instruction is configured to complete matrix operation in the neural network, including matrix multiply vector operation, vector multiply matrix operation, matrix multiply scalar operation, outer product operation, matrix add matrix operation, and matrix subtract matrix operation, the Cambricon vector computation instruction is configured to complete vector operation in the neural network, including vector basic operations, vector transcendental functions operation, dot product operation, random vector generator operation, and operation of maximum/minimum of a vector, and the Cambricon scalar computation instruction is configured to complete scalar operation in the neural network, including scalar basic operations, and scalar transcendental functions operation; and
a Cambricon logical instruction configured for the logical operation of the neural network, including a Cambricon vector logical computation instruction and a Cambricon scalar logical computation instruction, where the Cambricon vector logical computation instruction includes vector compare operation, vector logical operation, and vector greater than merge operation, the vector logical operation includes AND, OR, and NOT, and the Cambricon scalar logical operation includes scalar compare operation and scalar logical operation.

9. The operation device of claim 8, wherein the Cambricon data transfer instruction supports one or more of the following data organization manners: matrix, vector, and scalar, the vector basic operations include vector addition, subtraction, multiplication, and division, the vector transcendental functions refer to functions which do not meet any polynomial equations taking polynomials as coefficients, and include an exponential function, a logarithmic function, a trigonometric function, and an anti-trigonometric function, the scalar basic operations include scalar addition, subtraction, multiplication, and division, the scalar transcendental functions refer to functions which do not meet any polynomial equations taking polynomials as coefficients, and include an exponential function, a logarithmic function, a trigonometric function, and an anti-trigonometric function, the vector compare includes greater than, smaller than, equal to, more than or equal to, less than or equal to, and unequal to, the vector logical operations include AND, OR, and NOT, the scalar compare includes greater than, smaller than, equal to, more than or equal to, less than or equal to, and unequal to, and the scalar logical operations include AND, OR, and NOT.

10. An operation method, comprising:
receiving weights, input neurons, an instruction, a weight dictionary, a neuron dictionary, and an operation codebook;
decoding the instruction to determine lookup control information; and
identifying output neurons in the operation codebook according to the lookup control information, the weights, the weight dictionary, the neuron dictionary, and the input neurons, wherein the instruction is a neural network-dedicated instruction, and the neural network-dedicated instruction includes:
a control instruction configured to control a neural network execution process;
a data transfer instruction configured to complete data transfer between different storage media, a data format including a matrix, a vector, and a scalar;
an computation instruction configured to complete arithmetic operation of a neural network and including a matrix computation instruction, a vector computation instruction, a scalar computation instruction, a convolutional neural network computation instruction, a fully connected neural network computation instruction, a pooling neural network computation instruction, a Restricted Boltzmann Machine (RBM) neural network computation instruction, a Local Response Normalization (LRN) neural network computation instruction, a Local Response Normalization (LRN) neural network computation instruction, a Long Short-Term Memory (LSTM) neural network computation instruction, a Recurrent Neural Networks (RNN) computation instruction, a rectified linear unit (ReLU) neural network computation instruction, a parametric rectified linear unit (PReLU) neural network computation instruction, a sigmoid neural network computation instruction, a tan h neural network computation instruction, and a maxout neural network computation instruction; and
a logical instruction configured to complete logical operation of the neural network and including a vector logical computation instruction and a scalar logical computation instruction.

11. The operation method of claim 10, wherein
the weight dictionary includes the weight positions and the weight indexes;
the neuron dictionary includes the input neurons and the neuron indexes; and
the operation codebook includes the weight indexes, the neuron indexes, and operation results of the weights and the input neurons.

12. The operation method of claim 11, wherein the identifying the output neurons in the operation codebook according to the lookup control information, the weights, and the input neurons includes:

determining neuron ranges to determine the neuron indexes in the neuron dictionary;
determining the weight positions to determine the weight indexes in the weight dictionary according to the weights, the input neurons, the weight dictionary, and the neuron dictionary; and
identifying the operation results in the operation codebook according to the weight indexes and the neuron indexes to determine the output neurons.

13. The operation method of claim 12, wherein the operation results include a result of at least one of the following operations: addition, multiplication, and pooling, where pooling includes average pooling, maximum pooling, and median pooling.

14. The operation method of claim 13, further comprising:
preprocessing input information to obtain the weights, the input neurons, the instruction, the weight dictionary, the neuron dictionary, and the operation codebook;
storing, after receiving the weights, the input neurons, the instruction, the weight dictionary, the neuron dictionary and the operation codebook, the weights, the input neurons, the instruction, the weight dictionary, the neuron dictionary, and the operation codebook;
receiving the output neurons; and
caching the instruction, the input neurons, the weights, and the output neurons.

15. The operation method of claim 14, further comprising caching the weight indexes and the neuron indexes.

16. The operation method of claim 15, wherein the preprocessing includes segmentation, Gaussian filtering, binarization, regularization, and/or normalization.

17. The operation method of claim 10, wherein the neural network-dedicated instruction includes at least one Cambricon instruction including an operation code and an operand, and the Cambricon instruction includes:
a Cambricon control instruction configured to control the execution process, including a JUMP instruction and a conditional branch instruction;
a Cambricon data transfer instruction configured to complete data transfer between different storage media and including a load instruction, a store instruction and a move instruction, where the load instruction is configured to load data from a main memory to a cache, the store instruction is configured to store the data from the cache to the main memory, and the move instruction is configured to move the data between the cache and another cache or between the cache and a register or between the register and another register;
a Cambricon computation instruction configured to complete the arithmetic operation of the neural network and including a Cambricon matrix computation instruction, a Cambricon vector computation instruction, and a Cambricon scalar computation instruction, where the Cambricon matrix computation instruction is configured to complete matrix operation in the neural network, including matrix multiply vector operation, vector multiply matrix operation, matrix multiply scalar operation, outer product operation, matrix add matrix operation, and matrix subtract matrix operation, the Cambricon vector computation instruction is configured to complete vector operation in the neural network, including vector basic operations, vector transcendental functions operation, dot product operation, random vector generator operation, and operation of maximum/minimum of a vector, and the Cambricon scalar computation instruction is configured to complete scalar operation in the neural network, including scalar basic operations and scalar transcendental functions operation; and a Cambricon logical instruction configured for the logical operation of the neural network, including a Cambricon vector logical computation instruction and a Cambricon scalar logical computation instruction, where the Cambricon vector logical computation instruction includes vector compare operation, vector logical operations, and vector greater than merge operation, the vector logical operations include AND, OR, and NOT, and the Cambricon scalar logical operation includes scalar compare operation and scalar logical operations.

18. The operation method of claim 17, wherein the Cambricon data transfer instruction supports one or more of the following data organization manners: the matrix, the vector, and the scalar, the vector basic operations include vector addition, subtraction, multiplication, and division, the vector transcendental functions refer to functions which do not meet any polynomial equations taking polynomials as coefficients, and include an exponential function, a logarithmic function, a trigonometric function, and an anti-trigonometric function, the scalar basic operations include scalar addition, subtraction, multiplication, and division, the scalar transcendental functions refer to functions which do not meet any polynomial equations taking polynomials as coefficients, and include an exponential function, a logarithmic function, a trigonometric function, and an anti-trigonometric function, vector compare includes greater than, smaller than, equal to, more than or equal to, less than or equal to, and unequal to, the vector logical operations include AND, OR, and NOT, the scalar compare includes greater than, smaller than, equal to, more than or equal to, less than or equal to, and unequal to, and the scalar logical operations include AND, OR, and NOT.

* * * * *